United States Patent
Lee

(10) Patent No.: US 7,299,544 B2
(45) Date of Patent: Nov. 27, 2007

(54) APPARATUS FOR SEPARATING CULL OF SEMICONDUCTOR PACKAGE MOLDING SYSTEM

(75) Inventor: Su Gueon Lee, Chungcheongbuk-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 412 days.

(21) Appl. No.: 10/875,477

(22) Filed: Jun. 24, 2004

(65) Prior Publication Data

US 2005/0125996 A1    Jun. 16, 2005

(30) Foreign Application Priority Data

Dec. 15, 2003    (KR)    ............ 10-2003-0091410

(51) Int. Cl.
*B23P 19/00* (2006.01)
(52) U.S. Cl. ............ 29/762; 29/712; 29/716; 29/720; 29/426.4; 29/827; 264/328.4; 264/328.19; 425/588
(58) Field of Classification Search ............ 29/827, 29/855–856, 426.5; 264/163, 605, 614, 619, 264/145, 272.17; 257/786, 687; 425/116, 425/121, 125, 562, 575, 588
See application file for complete search history.

(56) References Cited

U.S. PATENT DOCUMENTS 5,507,633 A * 4/1996 Osada et al. ............ 425/116
5,520,874 A * 5/1996 Chou et al. ............ 264/328.4
6,080,354 A * 6/2000 Miyajima ............ 264/511
6,523,254 B1 * 2/2003 Street et al. ............ 29/841
2005/0125996 A1 * 6/2005 Lee ............ 29/762

FOREIGN PATENT DOCUMENTS

| JP | 61-98521 | * | 5/1986 |
| JP | 62-124747 | | 6/1987 |
| JP | 62-212112 | * | 9/1987 |
| JP | 02-307627 | | 12/1990 |
| JP | 06-061281 | | 3/1994 |
| JP | 07-241888 | | 9/1995 |
| JP | 2000-299329 | | 10/2000 |
| JP | 2002-28946 | * | 1/2002 |

* cited by examiner

*Primary Examiner*—Minh Trinh
(74) *Attorney, Agent, or Firm*—Ladas & Parry LLP

(57) ABSTRACT

Disclosed is an apparatus for separating culls coupled to a lead frame when a semiconductor chip is molded. The apparatus includes a lower plate, on which culls coupled to a lead frame are placed, an upper plate pressing culls placed on the lower plate in order to separate culls from the lead frame, a pilot pin installed in the upper plate by passing through the upper plate in order to press culls together with the upper plate when the upper plate presses the culls, and a sensor unit installed adjacent to the movement path of the pilot pin so as to detect a movement of the pilot pin. When culls are separated, faults of articles caused by a molding material insufficiently filled in a mold are checked through detecting a movement of the pilot pin.

10 Claims, 2 Drawing Sheets

APPARATUS FOR SEPARATING CULL OF SEMICONDUCTOR PACKAGE MOLDING SYSTEM

BACKGROUND OF THE INVENTION

1. Field of the Invention

The present invention relates to a cull separation apparatus of a semiconductor package molding system, and more particularly to an apparatus separating culls coupled to a lead frame when a semiconductor chip is molded.

2. Description of the Prior Art

In order to fabricate a semiconductor package, a molding process is carried out in order to surround a semiconductor chip with mold material, such as thermosetting resin (for example, epoxy resin), after performing a bonding wire process for protecting the semiconductor chip from external impact or external environment. That is, since the semiconductor chip is surrounded by mold material through the molding process, the semiconductor chip may be prevented from being damaged by an external contamination source or external impact.

By-products called "culls" are created when performing such a molding process. That is, as shown in FIG. 1, culls 3 are coupled to a lead frame 2 having semiconductor chips 1 as by-products. This is because a mold for performing the molding process has a structure, which forms culls.

Accordingly, as shown in FIG. 2, it is necessary to separate the culls 3 from the lead frame 2 by using a cull separation apparatus. Firstly, the culls 3 coupled with the lead frame 2 are placed on a lower plate 21. Then, the culls 3 are pressed by means of an upper plate 22. At this time, pressing action for the upper plate 22 is carried out through up and down movements of a cylinder connected to the upper plate 22. Accordingly, the culls 3 are broken due to the pressing action of the upper plate 22, so that the culls 3 are separated from the lead frame 2.

When such a molding process is performed, the molding material is often insufficiently filled in the mold, thereby generating faults. However, it is not easy to detect such faults in an early stage. That is, after the molding process has been finished, a separate inspection process utilizing X-rays must be carried out in order to detect the faults of articles.

Accordingly, since the faults of articles cannot be detected in the early stage during the molding process, productivity of semiconductor devices is decreased.

SUMMARY OF THE INVENTION

Therefore, the present invention has been made to solve the above-mentioned problems occurring in the prior art, and an object of the present invention is to provide a cull separation apparatus of a semiconductor package molding system capable of detecting faults in an early stage of the faults, which may be generated due to molding material insufficiently filled in a mold when a semiconductor package molding process is carried out.

In order to accomplish this object, there is provided a cull separation apparatus of a semiconductor package molding system, the cull separation apparatus comprising a lower plate, on which culls coupled to a lead frame are placed; an upper plate pressing culls placed on the lower plate in order to separate culls from the lead frame; a pilot pin installed in the upper plate by passing through the upper plate in order to press culls together with the upper plate when the upper plate presses the culls; and a sensor unit installed adjacent to the movement path of the pilot pin so as to detect a movement of the pilot pin.

The sensor unit is installed on an upper surface of the upper plate and includes a light receiving device and a light emitting device.

According to the preferred embodiment of the present invention, a chuck separation device including a pilot pin and a sensor unit is further provided. Therefore, when culls are separated, faults of articles caused by the molding material insufficiently filled in a mold can be instantly checked through detecting the movement of the pilot pin. Accordingly, it is not necessary to separately carry out a checking process for faults caused by the molding material insufficiently filled in the mold.

BRIEF DESCRIPTION OF THE DRAWINGS

The above object, features and advantages of the present invention will be more apparent from the following detailed description taken in conjunction with the accompanying drawings, in which.

DETAILED DESCRIPTION OF THE PREFERRED EMBODIMENTS

Figure 1:
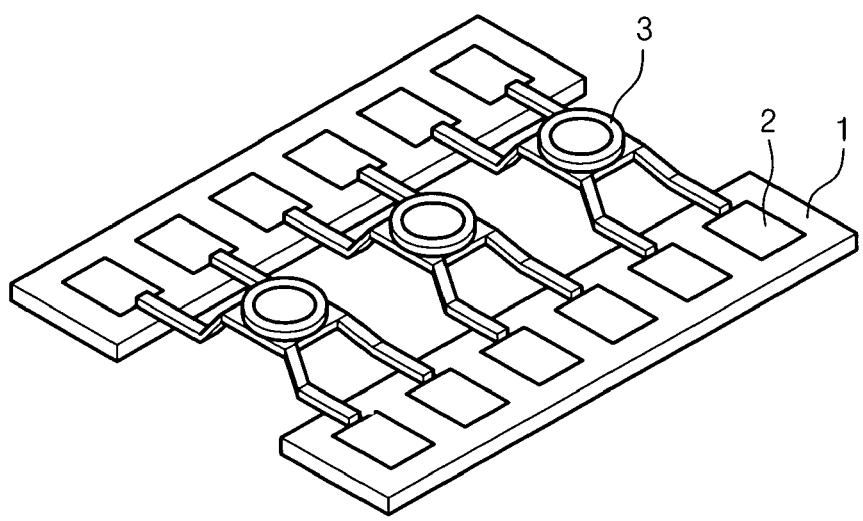
FIG. 1 is a view showing a molded semiconductor package.
Figure 2:
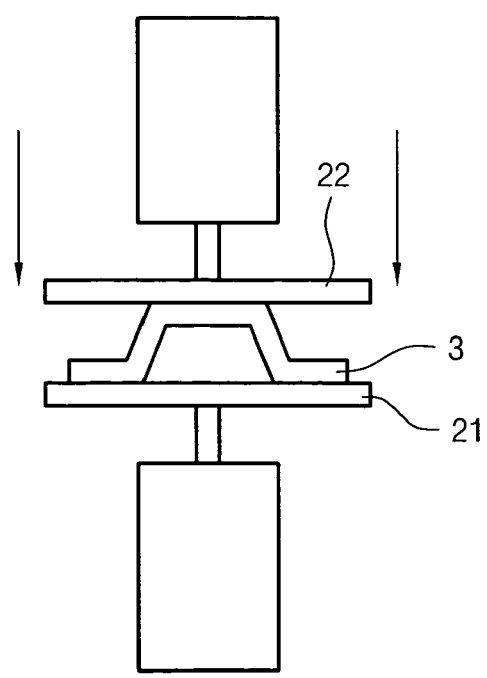
FIG. 2 is a schematic sectional view showing a cull separation apparatus of a conventional semiconductor package molding system.

Hereinafter, a preferred embodiment of the present invention will be described with reference to the accompanying drawings. In the following description and drawings, the same reference numerals are used to designate the same or similar components, and so repetition of the description on the same or similar components will be omitted.

Figure 3A:
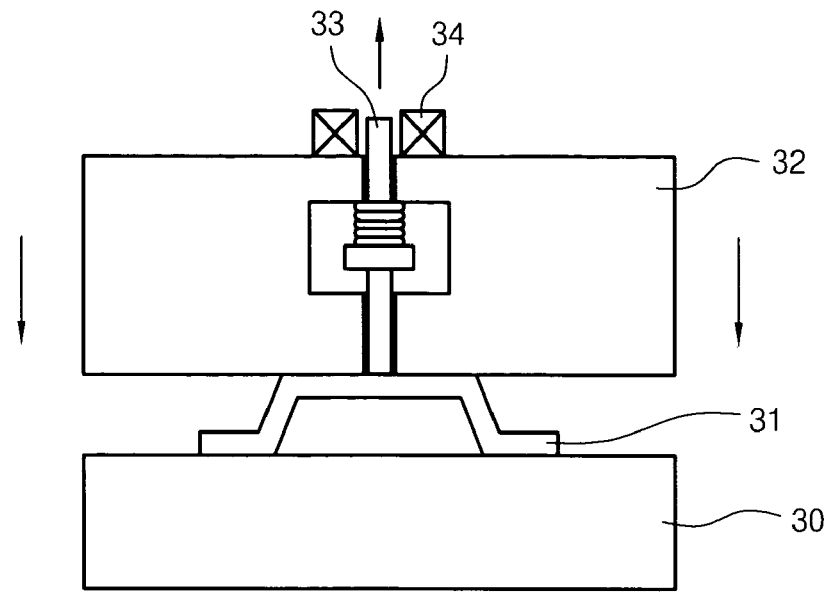
FIGS. 3A and 3B are views showing operational states of a cull separation apparatus of a semiconductor package molding system according to one embodiment of the present invention.
Figure 3B:
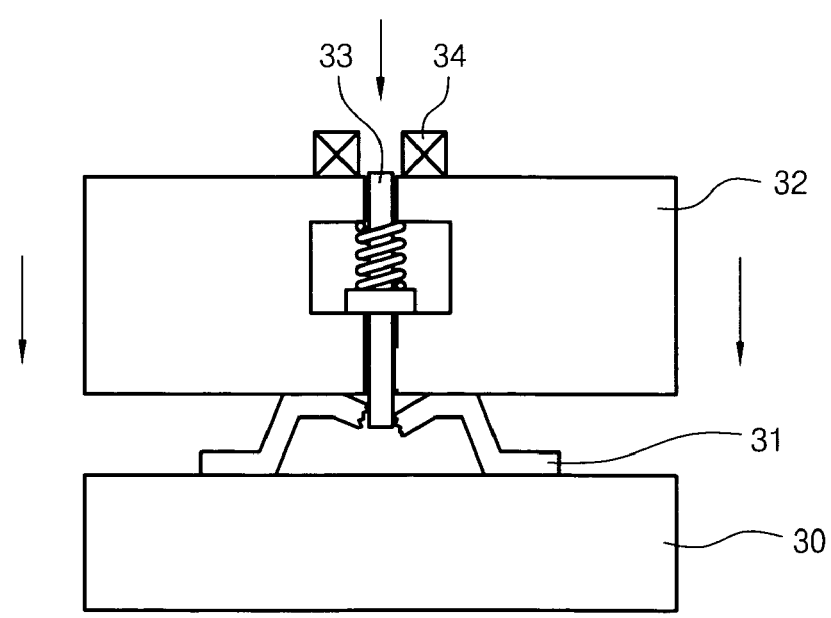

FIGS. 3A and 3B are views showing operational states of a cull separation apparatus of a semiconductor package molding system according to one embodiment of the present invention.

Referring to FIG. 3A, the cull separation apparatus includes an upper plate 32 and a lower plate 30. Herein, culls 31 coupled to a lead frame are placed on the lower plate 30, and the upper plate 32 presses the culls 31 placed on the lower plate 30. At this time, the upper plate 32 is connected to a cylinder (not shown) in order to press the culls 31. Accordingly, the culls 31 are pressed by the upper plate 32 in a state in which the culls 31 are placed on the lower plate 30, so the culls 31 are broken by the pressing action of the upper plate 32 and are separated from the lead frame.

In addition, a pilot pin 33 is provided in the upper plate 32 by passing through the upper plate 32. Herein, the pilot pin 33 presses the culls 31 together with the upper plate 32 when the upper plate 21 presses the culls 31. To this end, the pilot pin 33 includes a stopper and a spring. Also, a sensor unit 34, such as a light receiving device and a light emitting device, is installed adjacent to an inlet of the upper plate 32, in which the inlet of the upper plate 32 may provide a movement path for the pilot pin 33 installed in the upper plate 32. Accordingly, the sensor unit 34 can detect a movement of the pilot pin 34.

As shown in FIG. 3A, by providing the pilot pin 33 and the sensor unit 34, the pilot pin 33 also presses the culls 31 when the upper plate 32 presses the culls 31. The pilot pin 33 moves along with the upper plate 32 so as to separate the culls from the lead frame. At this time, if the culls 31 are formed in a state in which molding material is sufficiently filled in the mold, the pilot pin 33 is scarcely moved. Thus, the sensor unit 34 does not operate.

However, as shown in FIG. 3B, if culls 31 are formed in a state in which molding material is insufficiently filled in the mold, the pilot pin 33 breaks the culls 31 by pressing the culls 31 when the culls 31 are separated from the lead frame by means of the upper plate 32. Accordingly, the pilot pin 33 moves towards the lower plate. At this time, the sensor unit 34 may operate so as to perform a sensing operation and to display a sensing result.

Accordingly, a fault caused by molding material insufficiently filled in the mold can be instantly detected when the culls 31 are separated from the lead frame. When the molding material is insufficiently filled in the mold, the culls 31 are generally formed with a thin thickness. For this reason, the culls 31 are easily broken when the pilot pin 33 presses the culls 31, so faults of the culls 31 can be easily checked.

As described above, according to the present invention, culls having a fault can be instantly checked when the culls are separated from the lead frame. In addition, the fault of the culls can be checked without using a separate apparatus. Thus, the present invention can improve productivity of semiconductor devices.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. An apparatus for separating a cull of a molding system of a semiconductor package, the apparatus comprising:
    a lower plate, on which culls coupled to a lead frame are placed;
    an upper plate pressing culls placed on the lower plate in order to separate culls from the lead frame;
    a retractable pilot pin installed in the upper plate by passing through the upper plate in order to press culls together with the upper plate when the upper plate presses the culls; and
    a motion sensor unit installed adjacent to the movement path of the pilot pin so as to detect a movement of the pilot pin.

2. The apparatus as claimed in claim 1, wherein the sensor unit is installed on an upper surface of the upper plate and includes a light receiving device and a light emitting device.

3. The apparatus as claimed in claim 1, wherein the pilot pin includes a stopper and a spring.

4. An apparatus for separating a cull of a molding system of a semiconductor package, the apparatus comprising:
    a lower plate, on which culls coupled to a lead frame are placed;
    an upper plate pressing culls placed on the lower plate in order to separate culls from the lead frame;
    a retractable pilot pin installed in the upper plate by passing through the upper plate in order to press culls together with the upper plate when the upper plate presses the culls; and
    a motion sensor unit Installed adjacent to the movement path of the pilot pin so as to detect a movement of the pilot pin, wherein the sensor unit is installed on an upper surface of the upper plate and includes a light receiving device and a light emitting device.

5. An apparatus for separating culls of a molding system of a semiconductor package, the apparatus comprising:
    a lower plate, on which culls coupled to a lead frame are placed;
    an upper plate, on which to separate culls from the lead frame by pressing onto the culls;
    a retractable pilot pin installed in the upper plate, the pilot pin configured to press culls together with the upper plate when the upper plate presses the culls; and
    a motion sensor unit configured to detect a movement of the pilot pin.

6. The apparatus as claimed in claim 5, wherein the sensor unit comprises a light receiving device and a light emitting device.

7. The apparatus as claimed in claim 6, wherein light emitted from the light emitting device towards the light receiving device is not blocked by the pilot pen when the pilot pin breaks culls before the upper plate separates culls from the lead frame.

8. The apparatus as claimed in claim 5, wherein the sensor unit is installed on an upper surface of the upper plate.

9. The apparatus as claimed in claim 6, wherein light emitted from the light emitting device towards the light receiving device is blocked by the pilot pen when the pilot pin does not break culls before the upper plate separates culls from the lead frame.

10. The apparatus as claimed in claim 5, wherein the sensor unit being installed adjacent to the movement path of the pilot pin so as to detect the movement of the pilot pin.

* * * * *